(12) United States Patent
Shim et al.

(10) Patent No.: US 12,376,456 B2
(45) Date of Patent: Jul. 29, 2025

(54) ELECTROLUMINESCENCE DISPLAY HAVING REPAIR STRUCTURE AND METHOD FOR MANUFACTURING THE SAME

(71) Applicant: LG Display Co., Ltd., Seoul (KR)

(72) Inventors: Sungbin Shim, Paju-si (KR); Sangpil Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 498 days.

(21) Appl. No.: 17/970,282

(22) Filed: Oct. 20, 2022

(65) Prior Publication Data

US 2023/0209895 A1 Jun. 29, 2023

(30) Foreign Application Priority Data

Dec. 23, 2021 (KR) ........................ 10-2021-0185979

(51) Int. Cl.
*H10K 59/121* (2023.01)
*H10D 86/40* (2025.01)
(Continued)

(52) U.S. Cl.
CPC ....... *H10K 59/1213* (2023.02); *H10D 86/443* (2025.01); *H10D 86/60* (2025.01);
(Continued)

(58) Field of Classification Search
CPC ........... H10K 59/1213; H10K 59/1216; H10K 59/131; H10K 71/861; H10D 86/60; H10D 86/443; H10D 86/441; H10D 86/423

See application file for complete search history.

(56) References Cited

U.S. PATENT DOCUMENTS 9,502,487 B2 11/2016 Jeong et al.
9,553,138 B2 * 1/2017 Kim ..................... H10K 59/131
(Continued)

FOREIGN PATENT DOCUMENTS

KR 10-2007-0066264 A 6/2007
KR 10-2015-0059949 A 6/2015
KR 10-2017-0135650 A 12/2017

OTHER PUBLICATIONS

European Patent Office, Extended European Search Report and Opinion, EP Patent Application No. 22204049.5, May 17, 2023, six pages.

*Primary Examiner* — Jose R Diaz
(74) *Attorney, Agent, or Firm* — Fenwick & West LLP

(57) ABSTRACT

The present disclosure relates to an electroluminescence display having a repair structure and method for manufacturing the same. An electroluminescence display according to the present disclosure comprises: a pixel on a substrate; a thin film transistor disposed in the pixel, the thin film transistor including a semiconductor layer, a gate electrode and a drain electrode; a light emitting diode disposed in the pixel, the light emitting diode connected to the drain electrode; and a repair element overlapping the light emitting diode. The repair element includes: a repair pattern formed of a material at a layer same with the semiconductor layer; a repair electrode on a gate insulating layer covering the repair pattern; and a repair line on an intermediate insulating layer covering the repair electrode, the repair line connecting to the drain electrode. The repair pattern and the repair electrode overlap the drain electrode disposed on the intermediate insulating layer.

18 Claims, 6 Drawing Sheets

(51) Int. Cl.
*H10D 86/60* (2025.01)
*H10K 59/12* (2023.01)
*H10K 59/131* (2023.01)
*H10K 71/00* (2023.01)

(52) U.S. Cl.
CPC ......... *H10K 59/131* (2023.02); *H10K 71/861* (2023.02); *H10K 59/1201* (2023.02)

(56) References Cited

U.S. PATENT DOCUMENTS

| | | |
|---|---|---|
| 9,761,644 B2 | 9/2017 | Jeong et al. |
| 2015/0144904 A1 | 5/2015 | Jeong et al. |
| 2016/0189593 A1 | 6/2016 | Lee et al. |
| 2016/0211314 A1 | 7/2016 | Kim et al. |
| 2017/0033168 A1 | 2/2017 | Jeong et al. |
| 2023/0171997 A1* | 6/2023 | Choi ................ H10K 59/1216 257/40 |
| 2023/0209894 A1* | 6/2023 | Shim ................ H10K 59/1213 257/40 |

* cited by examiner

ELECTROLUMINESCENCE DISPLAY HAVING REPAIR STRUCTURE AND METHOD FOR MANUFACTURING THE SAME

CROSS-REFERENCE TO RELATED APPLICATIONS

This application claims the benefit of the Republic of Korea Patent Application No. 10-2021-0185979 filed on Dec. 23, 2021, which is hereby incorporated by reference in its entirety.

BACKGROUND

Field of the Invention

The present disclosure relates to an electroluminescence display having a repair structure and method for manufacturing the same. In particular, the present disclosure relates to an electroluminescence display having a repair structure in which a defected pixel is not processed to be a dark (or black) pixel, but is connected (or detoured) with a normal operating neighboring pixel.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In particular, the electroluminescent display which is a self-luminous display, has an excellent optical performance such as a viewing angle and color realization degree, so that its application field is gradually widening and is receiving attention as an image display device. Due to these advantages, the electroluminescence display is attracting attention as the most suitable display for realizing a 4K ultra-high-resolution display up to an 8K resolution display. As the resolution is increased, the size of the pixel becomes smaller and the size of the emission area occupied by the pixel also becomes smaller. When the size of the pixel of the electroluminescence display becomes small, it is necessary to secure the size of the emission area as much as possible. To do so, a top emission type structure is applied.

In addition, as the resolution increases, the frequency of occurrence of pixel defects increases due to the electrical connectivity between the element in the pixel or the defect of the element itself. When a pixel is defective, a dark spot processing may be considered, or a repair method for connecting to a neighboring normal pixel may be considered. The repair element includes a cutting part for breaking the connection between the light emitting element and the defective driving element, and a welding part for bypassing the defective driving element and connecting to neighboring normal driving element. For the ultra-high-resolution electroluminescence display of top emission type, the emission area may be reduced in order to ensure the area for placing the repair element. This is because the LASER irradiation area is configured not to overlap the emission area in order not to damage the light emitting element disposed in the emission area during the LASER irradiation process for repair.

In other words, when the repair element is disposed not to overlap with the emission area, an area for the repair element is required within the pixel area, so the emission area may be reduced within the pixel area. Thus, increasing resolution is limited. Accordingly, for the electroluminescence display having a top emission type and ultra-high-resolution structure, it is required to develop a new repair structure capable of solving the resolution limitation problem caused by the repair element.

SUMMARY

The purpose of the present disclosure, as for solving the problems described above, is to provide an electroluminescence display in which a repair element is overlapped with an emission area to implement the ultra-high resolution. Another purpose of the present disclosure is to provide an electroluminescence display having a repair structure that a cutting portion and a welding portion are processed simultaneously by irradiating a semiconductor layer with a laser having low energy.

In order to accomplish the above-mentioned purposes of the present disclosure, an electroluminescence display according to the present disclosure comprises: a pixel on a substrate; a thin film transistor disposed in the pixel, the thin film transistor including a semiconductor layer, a gate electrode and a drain electrode; a light emitting diode disposed in the pixel, the light emitting diode connected to the drain electrode; and a repair element overlapping the light emitting diode. The repair element includes: a repair pattern formed of a material at a layer same with the semiconductor layer; a repair electrode on a gate insulating layer covering the repair pattern; and a repair line on an intermediate insulating layer covering the repair electrode, the repair line connecting to the drain electrode. The repair pattern and the repair electrode overlap the drain electrode disposed on the intermediate insulating layer.

In one embodiment, the pixel is defective, the semiconductor layer and the repair pattern cut off, and the repair electrode and the drain electrode disposed on the repair pattern are physically connected by penetrating the intermediate insulating layer.

In one embodiment, the repair electrode and the drain electrode are connected by melting.

In one embodiment, light emitting element includes: an anode electrode including an opaque metal material, the anode electrode connected to the drain electrode of the thin film transistor; an emission layer disposed on the anode electrode; and a cathode electrode disposed on the emission layer, the cathode electrode including a transparent conductive material. A light generated from the emission layer is emitted to the cathode electrode.

In one embodiment, the light generated from the emission layer of the light emitting element is emitted to the cathode electrode at portions where the repair electrode overlaps the drain electrode of the thin film transistor.

In addition, an electroluminescence display according to an embodiment of the present disclosure comprises: a first pixel and a second pixel disposed on a substrate; a first switching thin film transistor disposed in the first pixel, a first driving thin film transistor connected to the first switching thin film transistor and a first light emitting element connected to the first driving thin film transistor; a second switching thin film transistor disposed in the second pixel, a second driving thin film transistor connected to the second switching thin film transistor and a second light emitting element connected to the second driving thin film transistor;

and a repair element overlapping the first light emitting element and the second light emitting element. The repair element includes: a repair pattern overlapping a driving drain electrode of the second driving thin film transistor, the repair pattern formed of a first material at a first layer same as a switching semiconductor layer of the second switching thin film transistor; a repair electrode overlapping the repair pattern on a gate insulating layer covering the switching semiconductor layer and the repair pattern, the repair electrode formed of a second material at a second layer same as a gate electrode of the second switching thin film transistor; and a repair line disposed on an intermediate insulating layer covering the repair electrode, the repair line connected to the repair electrode and to a drain electrode of the first driving thin film transistor.

In one embodiment, the first pixel is normal and the second pixel is defective, the switching semiconductor layer of the second switching thin film transistor and the repair pattern are cut off; and the repair electrode penetrates the intermediate insulating layer to connect the driving drain electrode of the second driving thin film transistor.

In one embodiment, the repair electrode and the driving drain electrode of the second driving thin film transistor are melted to connect each other.

In one embodiment, the second light emitting element includes: an anode electrode including an opaque metal material, the anode electrode connected to the drain electrode of the second driving thin film transistor; an emission layer disposed on the anode electrode; and a cathode electrode disposed on the emission layer, the cathode electrode including a transparent conductive material. A light generated from the emission layer is emitted to the cathode electrode.

In one embodiment, the light generated from the emission layer of the second light emitting element is emitted to the cathode electrode at portions where the repair electrode overlaps the drain electrode of the second driving thin film transistor.

In addition, a method for manufacturing an electroluminescence display comprises: forming a first driving element in a first pixel, a second driving element in a second pixel adjacent to the first pixel, and a repair element on a substrate, the repair element connected to the first driving element, extending to the second pixel and overlapping the second driving element; forming a first light emitting element disposed on and connected to the first driving element, and a second light emitting element disposed on and connected to the second driving element; inspecting whether the first driving element and the second driving element are defective; and conducting a repair process in which the second driving element is disabled and the second light emitting element is connected to the first driving element via the repair element, wherein the first driving element is normal and the second driving element is defective.

In one embodiment, the first driving element includes: a first gate electrode, a first semiconductor layer overlapping the first gate electrode, a first source electrode connected to one portion of the first semiconductor layer and a first drain electrode connected to another portion of the first semiconductor layer. The second driving element includes: a second gate electrode, a second semiconductor layer overlapping the second gate electrode, a second source electrode connected to one portion of the second semiconductor layer and a second drain electrode connected to another portion of the second semiconductor layer. The repair element includes: a repair pattern overlapping the second drain electrode, the repair pattern formed of a first material at a first layer same with the second semiconductor layer; a repair electrode disposed on a gate insulating layer covering the second semiconductor layer and the repair pattern, the repair electrode formed of a second material at a second layer same with the second gate electrode; and a repair line disposed on an intermediate insulating layer covering the repair electrode, the repair line connected to the repair electrode, extending to the first pixel and connected to the first drain electrode.

In one embodiment, the repair process includes: cutting some portions of the second semiconductor layer, and removing the repair pattern and connecting the repair electrode to the second drain electrode.

In one embodiment, the repair process is conducted by irradiating a laser on some portions of the second semiconductor layer, on the repair pattern and on a place where the repair electrode and the second drain electrode overlap, so that the repair electrode and the second drain electrode are melted and connected each other.

In one embodiment, the repair process is conducted by irradiating the laser having a wavelength of 266 nm in a direction from a below direction of the substrate toward the second light emitting element.

In still another embodiment, an electroluminescence display comprises a first pixel including a first switching transistor, a first driving transistor, and a first light emitting element; a second pixel including a second switching transistor, a second driving transistor, and a second light emitting element; a repair element at least a part of which overlapping the first pixel and the second pixel; wherein the second switching transistor includes a semiconductor layer including a first part and a second part electrically disconnected from the first part of the semiconductor layer; wherein the repair element includes: a repair pattern overlapping a drain electrode of the second driving transistor, the repair pattern formed of a same material as the semiconductor layer of the second switching transistor and including a first portion and a second portion electrically disconnected from the first portion of the repair pattern; a repair electrode overlapping the repair pattern on a gate insulating layer covering the semiconductor layer and the repair pattern, the repair electrode formed of a same material as a gate electrode of the second switching transistor and joined with the drain electrode of the second driving transistor; and a repair line disposed on an intermediate insulating layer covering the repair electrode, the repair line electrically connected to the repair electrode and to a drain electrode of the first driving transistor; and wherein an anode of the second light emitting element of the second pixel is electrically connected to the drain electrode of the first driving transistor of the first pixel via the drain electrode of the second driving transistor, the repair electrode, and the repair line. The first pixel may be a normal pixel and the second pixel may be a defective pixel. The repair electrode and the drain electrode of the second driving transistor are melted to be joined with each other.

The electroluminescent display according to the present disclosure comprises a repair element overlapped with an emission area of the light emitting element. Accordingly, there is no resolution constraint problem caused by the repair element, so it is easy to implement ultra-high resolution. In addition, the cutting process and the welding process are performed with low energy using a 266 nm wavelength laser. Even though the repair element is disposed overlapping the light emitting element, both the repair cutting process and the welding process may be simultaneously performed with low energy. Accordingly, the light emitting element overlapping the repair element is not damaged by thermal energy generated in the repair process. Further, the present disclosure may provide an ultra-high-resolution electroluminescence display having a repair structure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
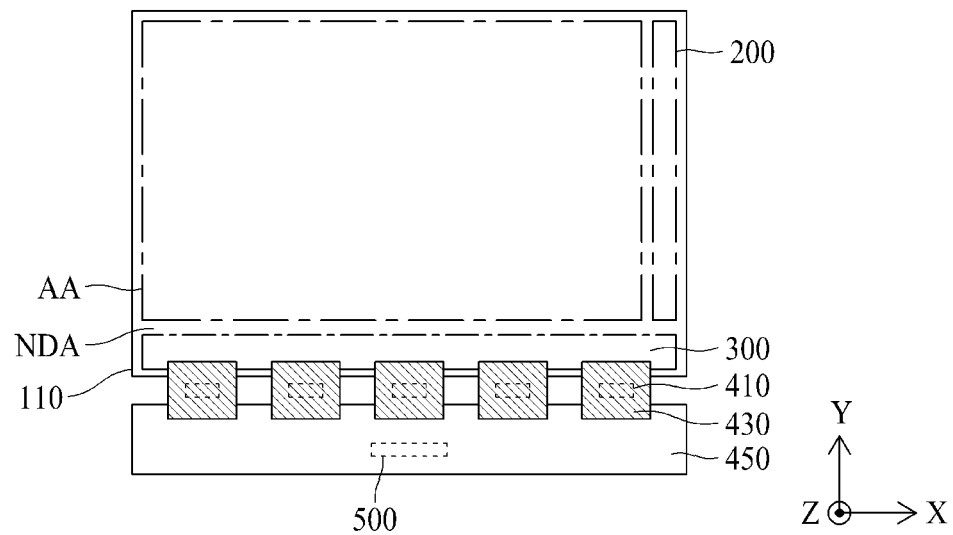
FIG. 1 is a plane view illustrating a schematic structure of an electroluminescence display according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function or configuration may be omitted.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for like elements wherever possible. In the following description, when a function and a configuration known to those skilled in the art are irrelevant to the essential configuration of the present disclosure, their detailed descriptions will be omitted.

The terms described in the specification should be understood as follows.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "linked", "coupled" or "connected" to another element that element may be directly linked, coupled or connected to or indirectly linked, coupled or connected to that other element, unless otherwise specified.

It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings.

Hereinafter, referring to attached figures, we will explain about the present disclosure, in detail. FIG. 1 is a diagram illustrating a schematic structure of an electroluminescence display according to the present disclosure. In FIG. 1, X-axis may be parallel to the extending direction of the scan line, Y-axis may be parallel to the extending direction of the data line, and Z-axis may represent the thickness direction of the display.

Referring to FIG. 1, the electroluminescence display comprises a substrate 110, a gate (or scan) driver 200, a data pad portion 300, a source driving IC (Integrated Circuit) 410, a flexible film (or a flexible circuit film) 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images (e.g., displaying video images), may be defined as the majority middle area of the substrate 110, but it is not limited thereto. In the display area AA, a plurality of scan lines (or gate lines), a plurality of data lines and a plurality of pixels may be formed or disposed. Each of the pixels may include a plurality of sub pixels. Each of the sub pixels includes the scan line and the data line, respectively.

The non-display area NDA, which is an area that does not represent (e.g., does not display) the video images, may be disposed adjacent to the display area AA. For example, the non-display area NDA may be defined at the circumference areas of the substrate 110 surrounding all or some of the display area AA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area AA on the substrate 110, as a GIP (gate driver in panel) type. GIP type means that the gate driver 200 is directly formed on the substrate 110 in one embodiment.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA at any one outside of the display area AA on the substrate 110, as a TAB (tape automated bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible circuit film 430 may include a plurality of first link lines connecting the data pad portion 300 to the source driving IC 410, and a plurality of second link lines connecting the data pad portion 300 to the circuit board 450. The flexible circuit film 430 may be attached on the data pad portion 300 using an anisotropic conducting film, so that the data pad portion 300 may be connected to the first link lines of the flexible circuit film 430.

The circuit board 450 may be attached to the flexible circuit film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 2:
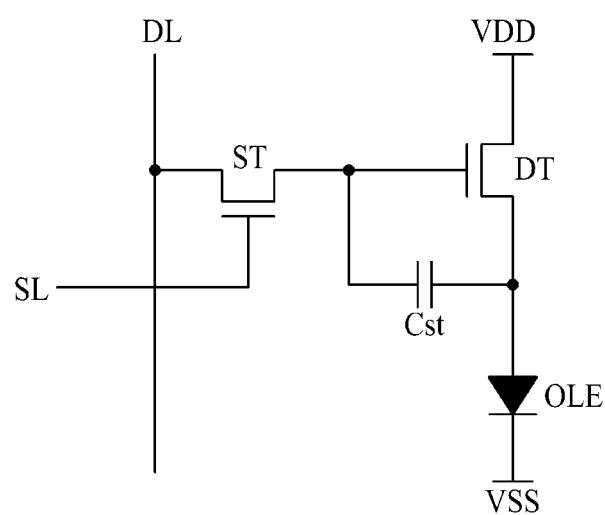
FIG. 2 is a circuit diagram illustrating a structure of one pixel according to one embodiment of the present disclosure.
Figure 3:
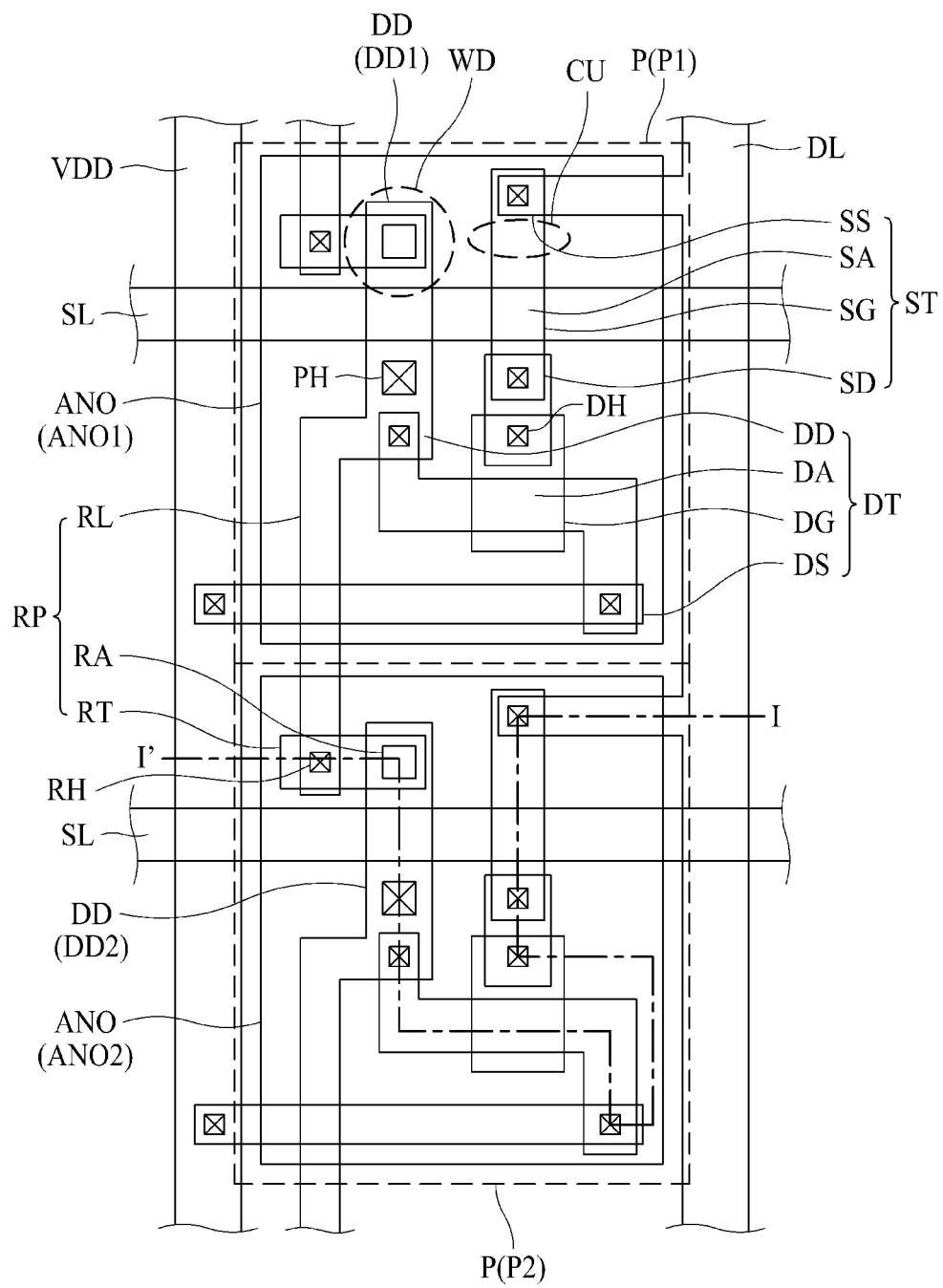
FIG. 3 is a plan view illustrating a structure of the pixels disposed in the electroluminescence display having a repair element according to one embodiment of the present disclosure.
Figure 4:
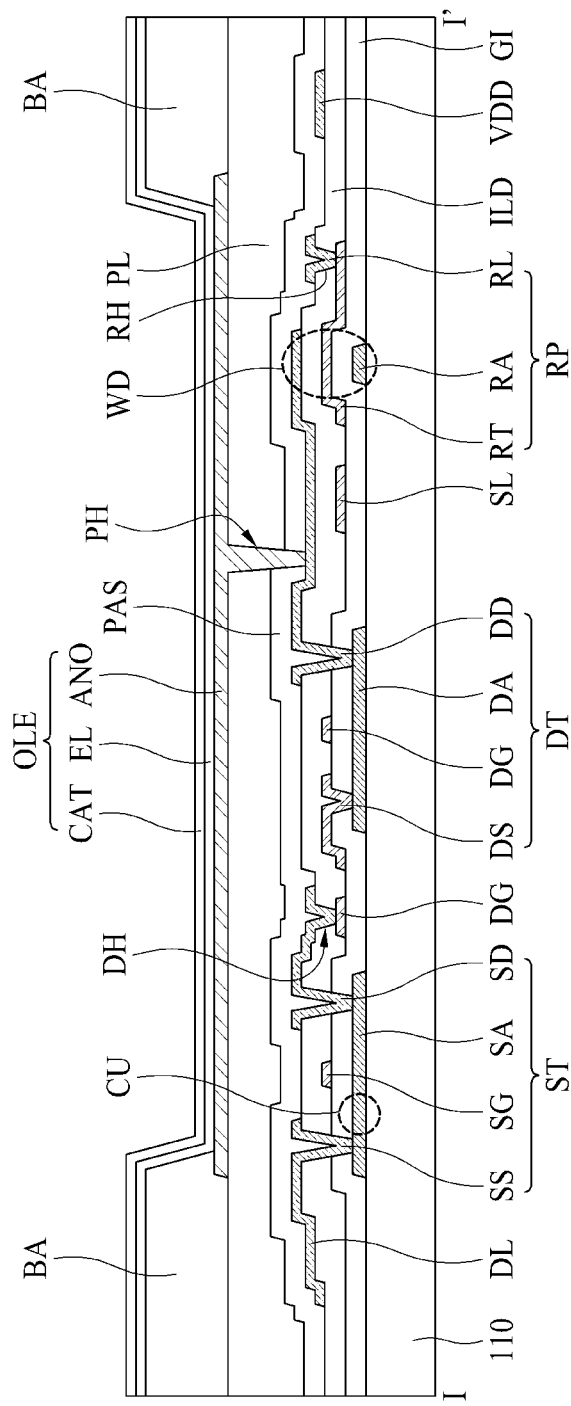
FIG. 4 is a cross-sectional view along the cutting line I-I' in FIG. 3, for illustrating the structure of the electroluminescence display having a repair element according to the present disclosure.

FIG. 2 is a circuit diagram illustrating a structure of one pixel according to one embodiment of the present disclosure. FIG. 3 is a plan view illustrating a structure of the pixels disposed in the electroluminescence display having a repair element according to one embodiment of the present disclosure. FIG. 4 is a cross-sectional view along the cutting line I-I' in FIG. 3, for illustrating the structure of the electroluminescence display having a repair element according to one embodiment of the present disclosure.

Referring to FIGS. 2 to 4, an electroluminescence display comprises a plurality of pixels P. Each pixel of the electroluminescence display may be defined by a scan line SL, a data line DL and a driving current line VDD. Each pixel of the light emitting display may include a switching thin film transistor ST, a driving thin film transistor DT, a light emitting diode OLE and a storage capacitance Cst. The driving current line VDD may be supplied with a high-level voltage for driving the light emitting diode OLE.

For example, the switching thin film transistor ST may be disposed at the portion where the scan line SL and the data line DL cross each other. The switching thin film transistor ST may include a switching gate electrode SG, a switching source electrode SS and a switching drain electrode SD. The switching gate electrode SG may be connected to the scan line SL, or be one portion of the scan line SL as shown in FIG. 3. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the pixel selected by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. For example, the switching drain electrode SD may be connected to the driving gate electrode DG via a drain contact hole DH penetrating the gate insulating layer GI covering the driving gate electrode DG. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE. In FIGS. 3 and 4, the storage capacitance Cst is not shown in order to avoid the complexity of the drawings.

The driving thin film transistor DT may be disposed between the driving current line VDD and the light emitting diode OLE. The driving thin film transistor DT may control the amount of electric current flowing to the light emitting diode OLE from the driving current line VDD according to the voltage level of the driving gate electrode DG connected to the switching drain electrode SD of the switching thin film transistor ST.

FIG. 4 shows that the thin film transistors ST and DT are formed in a top-gate structure. In one embodiment, the top gate electrode means that the gate electrodes SG and DG are formed on the semiconductor layers SA and DA. For example, the top gate structure is that the semiconductor layers SA and DA are first formed on the substrate 110, and the gate electrodes SG and DG are formed on the gate insulating layer GI covering the semiconductor layers SA and DA. However, it is not limited thereto. For another example, the electroluminescence display according to the present disclosure may have the bottom gate structure. The bottom gate structure is that the gate electrode may be first formed on the substrate and then the semiconductor layer is formed on the gate insulating layer covering the gate electrode.

In addition, for the case of the top gate structure shown in FIG. 4, an intermediate insulating layer ILD may be deposited on the gate electrodes SG and DG. The data line DL, the source electrodes SS and DS, the drain electrodes SD and DD, and the driving current line VDD are disposed on the intermediate insulating layer ILD. Here, the driving source electrode DS of the driving thin film transistor DT may be formed on the same layer as the driving gate electrode DG, unlike the switching source electrode SS. This is to prevent the repair line RL formed on the same layer as the drain electrodes SD and DD, which will be described later, from directly contacting the driving drain electrode DD with each other.

The light emitting diode OLE may include an anode electrode ANO, an emission layer EL and a cathode electrode CAT. The light emitting diode OLE may emit the light according to the amount of the electric current controlled by the driving thin film transistor DT. In the light emitting diode OLE, the amount of light emitted is controlled by the current controlled by the driving thin film transistor DT, so that the luminance of the electroluminescence display may be adjusted. The anode electrode ANO of the light emitting diode OLE is connected to the driving drain electrode DD of the driving thin film transistor DT, and the cathode electrode CAT is connected to the low power supply line VSS to which a low potential voltage is supplied. In other words, the light emitting diode OLE may be driven by the voltage differences between the low-level voltage and the high-level voltage controlled by driving thin film transistor DT.

A passivation layer PAS is deposited on the surface of the substrate 110 having the thin film transistors ST and DT. In one embodiment, the passivation layer PAS is made of inorganic materials such as silicon oxide or silicon nitride. A planarization layer PL is deposited on the passivation layer PAS. The planarization layer PL may be a film layer for flattening the non-uniform (or uneven) surface of the substrate 110 on which the thin film transistors ST and DT are formed. In order to make the uneven surface condition uniform, the planarization layer PL may be made of organic materials. The passivation layer PAS and the planarization layer PL have a pixel contact hole PH exposing some of the driving drain electrode DD of the driving thin film transistor DT.

An anode electrode ANO is formed on the planarization layer PL. The anode electrode ANO is connected to the driving drain electrode DD of the driving thin film transistor DT via the pixel contact hole PH. The anode electrode ANO may have different structure according to the emission type of the light emitting diode OLE. In the example of the bottom emission type in which the light is emitted to the direction where the substrate 110 is disposed, the anode electrode ANO may be made of transparent conductive materials. For an example of the top emission type in which the light is emitted to the direction opposite the substrate 110, the anode electrode ANO may be made of metal materials having excellent light reflectance. For example, the anode electrode ANO may be made of an opaque metal material including any one of silver (Ag), aluminum (Al), molybdenum (Mo), titanium (Ti), copper (Cu), gold (Au), magnesium (Mg), calcium (Ca) or barium (Ba) or an alloy of them.

In one embodiment of the present disclosure, the top emission type is suitable for realization of ultra-high resolution. In the top emission type, the anode electrode ANO has a maximum area in a pixel area defined by the data line DL, the driving current line VDD and the scan line SL. In this case, the thin film transistors ST and DT may be disposed to overlap with the anode electrode ANO under the anode electrode ANO. In addition, the data line DL, the driving current line VDD and the scan line SL may also partially overlap the anode electrode ANO. In FIG. 3, in order to avoid the complexity of the drawing, the anode electrode ANO is illustrated as being not overlapped with the lines.

A bank BA is formed on the anode electrode ANO. The bank BA may cover the circumference areas of the anode electrode ANO, and expose most of middle portions of the anode electrode ANO. The exposed area of the anode electrode ANO by the bank BA may be defined as an emission area of the pixel.

In the top emission type, the thin film transistors ST and DT may be disposed as being overlapped with the emission area. In addition, some portions of the data line DL, the driving current line VDD and the scan line SL may be overlapped with the emission area.

An emission layer EL is deposited on the anode electrode ANO and the bank BA. The emission layer EL may be deposited on the entire display area AA as covering the anode electrode ANO and the bank BA. For an embodiment, the emission layer EL may include two or more emission layers which are vertically stacked for combining and emitting white light. For example, the emission layer EL may include a first emission layer and a second emission layer for combining a first color light and a second color light to emit white light.

For another embodiment, the emission layer EL may include any one of blue emission layer, green emission layer and red emission layer for providing color light allocated at the pixel. In this case, the emission layer EL may be disposed as being isolated within each emission area defined by the bank BA. In addition, the light emitting diode OLE may further include functional layers for enhancing the emission efficiency and/or the emission time of the emission layer EL.

A cathode electrode CAT is deposited on the emission layer EL as being in surface-contact with the emission layer EL. The cathode electrode CAT is deposited to cover the entire surface of the substrate 110 and be connected with the emission layer EL disposed at all pixels. For the top emission type, it is preferable that the cathode electrode CAT may be made of transparent conductive material such as indium-tin-oxide (ITO) or indium-zinc-oxide (IZO).

The electroluminescence display according to one embodiment of the present disclosure may further comprise a repair element RP. The repair element RP may be a structure to make any defected pixel operate like normal functioning pixel that emits light without darkening the defective pixel.

The repair element RP may include a repair line RL and a repair electrode RT and a repair pattern RA according to one embodiment. The repair line RL may be disposed between a first pixel P1 and a second pixel P2 adjacent the first pixel P1. The repair electrode RT may include a first end portion contacting the end of the repair line RL and a second end portion overlapping the driving drain electrode DD.

The repair pattern RA may be formed of the same material as the semiconductor layers SA and DA on the substrate 110. The repair pattern RA may be formed in an island shape overlapping a portion of the repair electrode RT that overlaps the driving drain electrode DD. A gate insulating layer GI may be deposited on the repair pattern RA.

The repair electrode RT overlapping the repair pattern RA is formed on the gate insulating layer GI. The repair electrode RT may be formed of the same material on the same layer as the gate electrodes SG and DG. The repair electrode RT may extend toward the repair line RL from a portion overlapping the repair pattern RA. An intermediate insulating layer ILD may be deposited as covering the repair electrode RT.

The repair line RL is formed on the intermediate insulating layer ILD. The repair line RL may be connected to the repair electrode RT via the repair contact hole RH formed at the intermediate insulating layer ILD. For example, referring to FIG. 3, the repair line RL disposed in the first pixel P1 may extend to the second pixel P2. The repair line RL extending to the second pixel P2 may be connected to the repair electrode RT formed in the second pixel P2 via the repair contact hole RH formed in the second pixel P2. The repair line RL may be formed of the same material on the same layer as the switching source electrode SS, the drain electrodes SD and DD, the data line DL and the driving current line VDD. Here, the driving drain electrode DD is formed to overlap the repair pattern RA and the repair electrode RT. A passivation layer PAS is deposited on the repair line RL.

A portion in which the driving drain electrode DD, the repair pattern RA and the repair electrode RT overlap each other may be defined as a welding part WD. It is preferable that the welding part WD may be located adjacent to the switching semiconductor layer SA of the switching thin film transistor ST. Further, the switching semiconductor layer SA adjacent to the welding part WD may be defined as the cutting part CU.

The repair element RP described above may refer to an element, when a defect occurs in any one pixel, for cutting the connection with the thin film transistor allocated in the anode electrode of the defective pixel, and for connecting the defective pixel to the driving thin film transistor allocated to the neighboring normal pixel. Hereinafter, referring to FIGS. 5 to 7, a structure in which a defect is solved by connecting to a normal pixel when a defective pixel occurs will be described.

Figure 5:
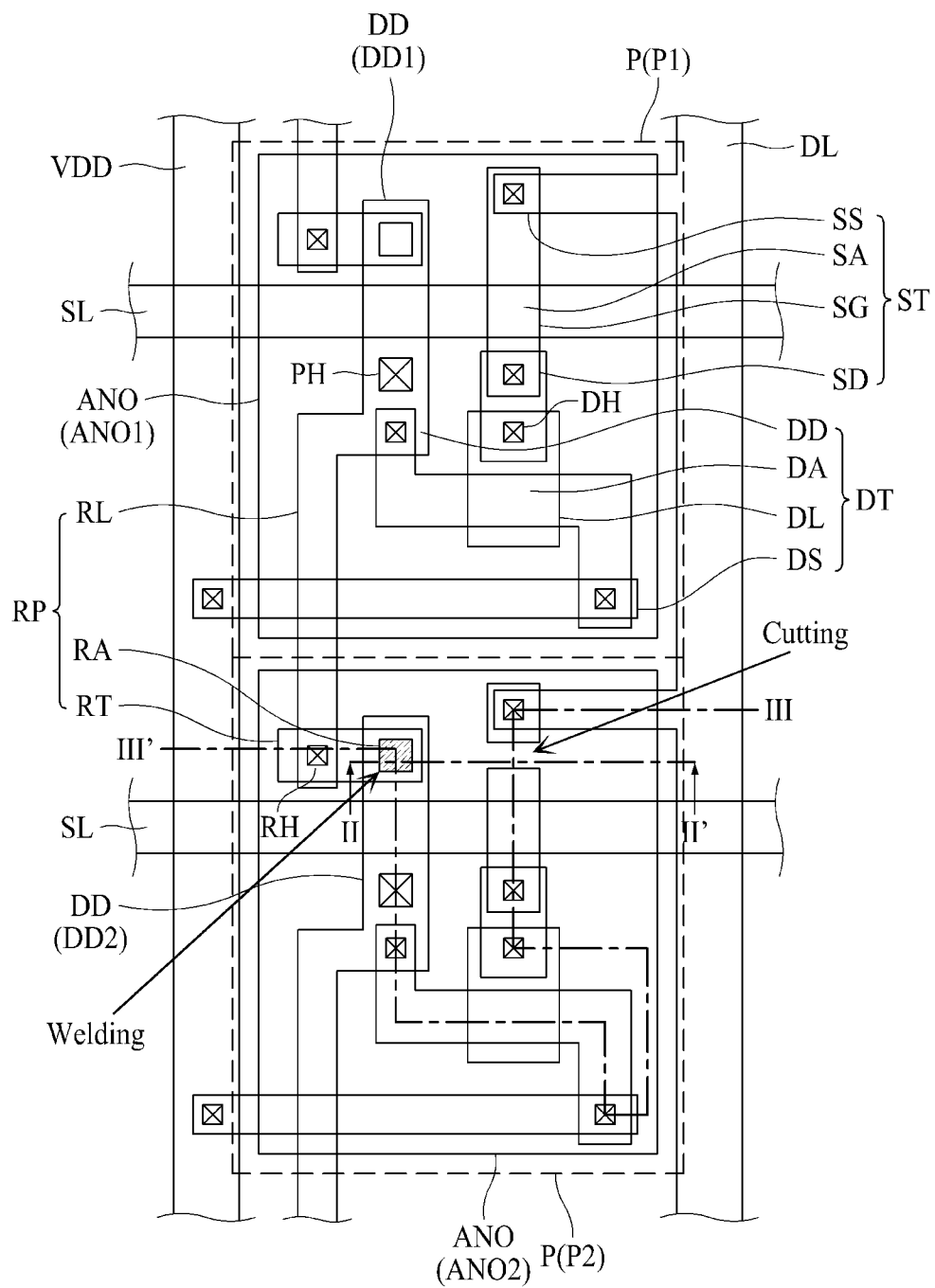
FIG. 5 is a plan view illustrating a structure after conducting welding and cutting process in the electroluminescence display having a repair element according to one embodiment of the present disclosure.
Figure 6A:
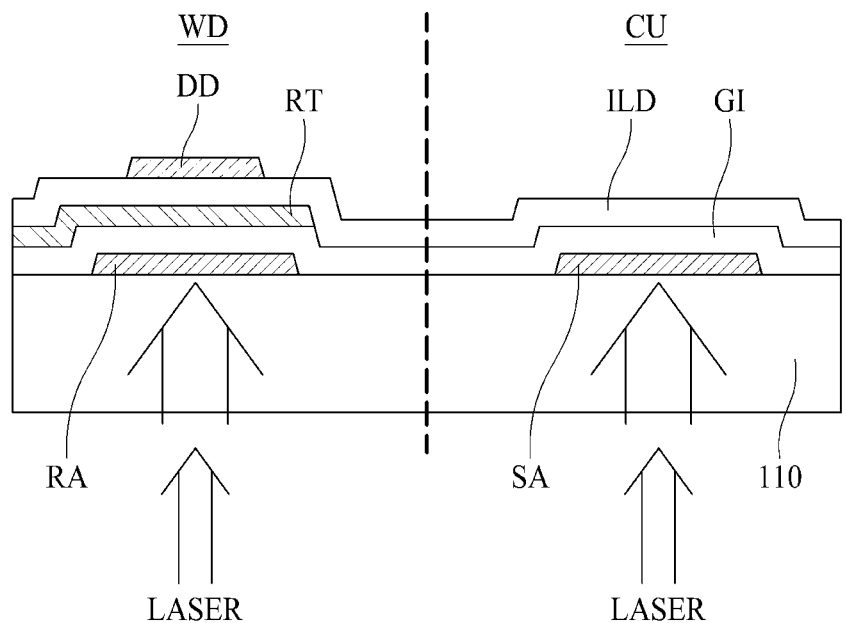
FIG. 6A is a cross-sectional view, along line II-II' in FIG. 5, for illustrating a structure of the cutting part and the welding part, before conducting repair process, in an electroluminescence display according to one embodiment of the present disclosure.
Figure 6B:
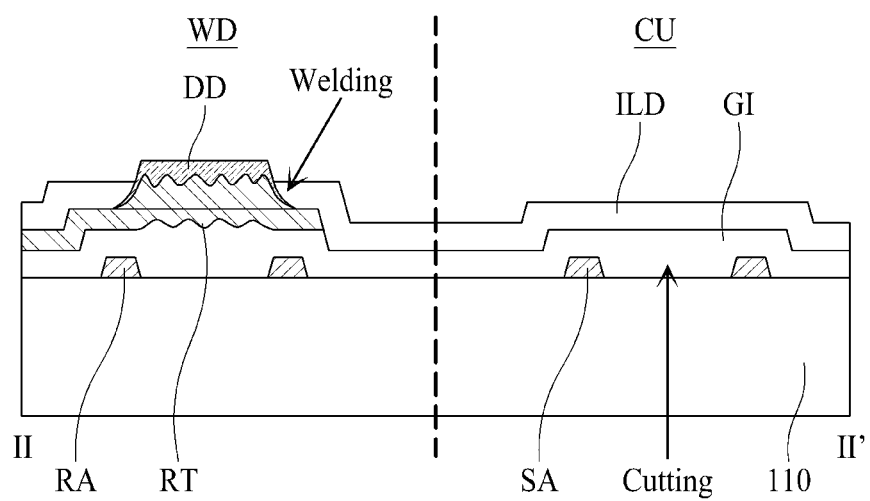
FIG. 6B is a cross-sectional view, along line II-II' in FIG. 5, for illustrating a structure of the cutting part and the welding part, after conducting repair process, in an electroluminescence display according to one embodiment of the present disclosure.
Figure 7:
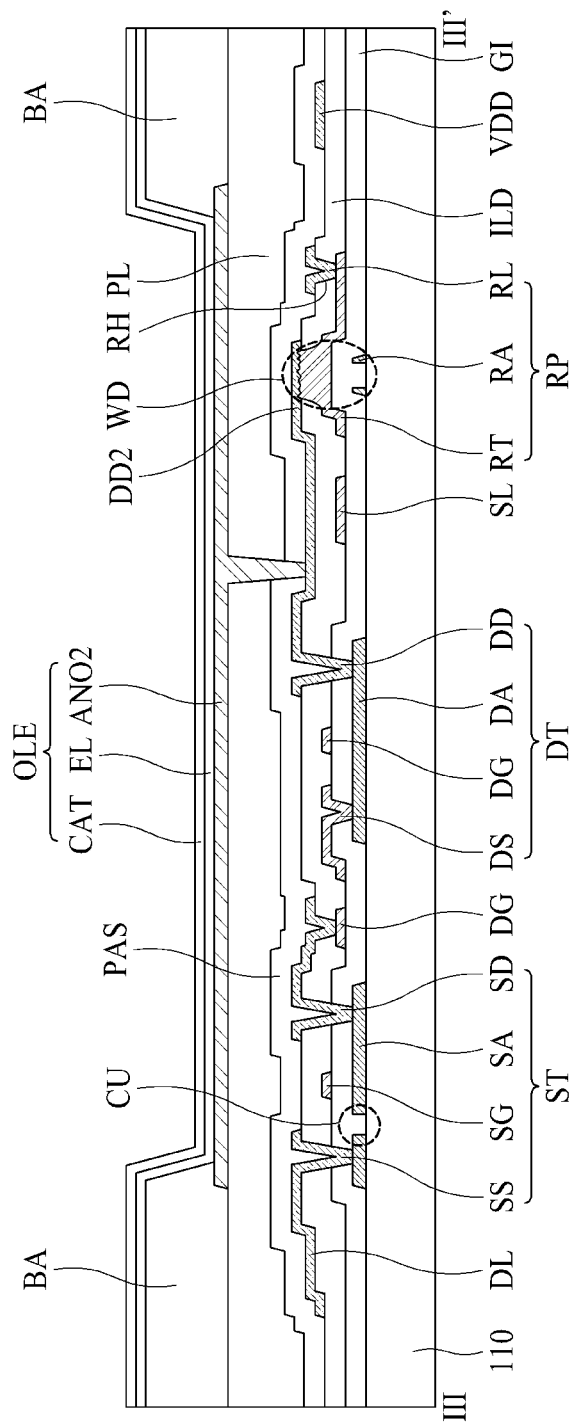
FIG. 7 is a cross-sectional view along line in FIG. 5, for illustrating a structure of the welding part and cutting part, after conducting the welding process and the cutting process, in the electroluminescence display having a repair element according to one embodiment of the present disclosure.

FIG. 5 is a plane view illustrating a structure after conducting welding and cutting process in the electroluminescence display having a repair element according to the present disclosure. FIG. 6A is a cross-sectional view, along line II-II' in FIG. 5, for illustrating a structure of the cutting part and the welding part, before conducting repair process, in an electroluminescence display according to the present disclosure. FIG. 6B is a cross-sectional view, along line II-II' in FIG. 5, for illustrating a structure of the cutting part and the welding part, after conducting repair process, in an electroluminescence display according to the present disclosure. FIG. 7 is a cross-sectional view along line II-II' in FIG. 5, for illustrating a structure of the welding part and cutting part, after conducting the welding process and the cutting process, in the electroluminescence display having a repair element according to the present disclosure.

An electroluminescence display according to the present disclosure comprises a plurality of pixels P arrayed in a matrix manner. For example, as shown in FIG. 5, a first pixel P1 and a second pixel P2 may be disposed adjacent to each other. A first anode electrode ANO1 may be disposed in the first pixel P1, and a second anode electrode ANO2 may be disposed in the second pixel P2. Since the configuration for the thin film transistors and the lines included in each of the pixels P1 and P2 is the same as described above, a detailed description thereof may be not duplicated in the following description.

The repair element RP may include a repair line RL, a repair electrode RT and a repair pattern RA. The repair element RP may be disposed across the first pixel P1 and the second pixel P2.

The repair line RL may be a segment line which branches from the first driving drain electrode DD1 of the driving thin film transistor DT connected to the first anode electrode ANO1, and extends to the second pixel P2. The repair line RL may be disposed parallel to the driving current line VDD and the data line DL. An end of the repair line RL may be disposed adjacent to the second driving drain electrode DD2 of the driving thin film transistor DT connected to the second anode electrode ANO2 disposed in the second pixel P2.

The repair electrode RT may be disposed such that a first end is connected to one end of the repair line RL, and a second end overlaps the second driving drain electrode DD2 disposed in the second pixel P2. Referring to the vertical structure as shown in FIG. 4, which is a cross-sectional view illustrating the state before conducting the repair process, an intermediate insulating layer ILD is interposed between the repair electrode RT and the second driving drain electrode DD2.

The repair pattern RA may be formed of the same material at the same layer as the semiconductor layers SA and DA. The repair pattern RA may be formed in an island shape overlapping with the repair electrode RT within a region where the repair electrode RT and the second driving drain electrode DD2 overlap. Referring to the vertical structure as shown in FIG. 4, which is a cross-sectional view illustrating the state before conducting the repair process, a gate insulating layer GI is interposed between the repair pattern RA and the repair electrode RT.

The first pixel P1 may be a normal pixel, but the second pixel P2 may be a defective pixel. The defective pixel may be in a state in which the anode electrode ANO2 may not be normally driven because a defect occurs in the switching thin film transistor ST or the driving thin film transistor DT. In this case, a repair method of darkening the defective second pixel P2 may be applied. This is a method of disabling the switching thin film transistor ST or the driving thin film transistor DT, which is an element driving the second anode electrode ANO2 disposed in the second pixel P2. In this case, the thin film transistor ST or DT may be disabled by cutting a part of the switching semiconductor layer SA or the driving semiconductor layer DA located closest to the substrate 110.

A repair method proposed in the present disclosure is a method of connecting a driving thin film transistor of a neighboring normal pixel and an anode electrode of a defective pixel, rather than darkening the defective pixel.

As shown in FIG. 5, the laser is irradiated to the area where the second driving drain electrode DD2, the repair pattern RA, and the repair electrode RT disposed in the defective second pixel P2 overlap each other. Accordingly, the repair electrode RT is welded to physically and electrically connect to the second driving drain electrode DD2. At the same time, the switching semiconductor layer SA of the switching thin film transistor ST disposed in the second pixel P2 is cut.

As a result, in the second pixel P2 in which the defect occurs, the switching thin film transistor ST that operates the driving thin film transistor DT for driving the second anode electrode ANO2 is disabled. At the same time, the second anode electrode ANO2 is connected to the first driving drain electrode DD1 disposed in the first pixel P1 by the repair element RP. Therefore, the second pixel P2 is in the same operating state as the first pixel P1.

Rather than darkening a defective pixel, it is driven by connecting to a neighboring normal pixel via the repair element RP according to the present disclosure. Therefore, it is possible to solve the problem of image quality deterioration due to defects.

In particular, in the electroluminescence display according to the present disclosure, when repairing a defective pixel, a laser having low energy in a wavelength band of 266 nm is used. Since the electroluminescence display according to the present disclosure has a top emission type structure, both the welding part WD and the cutting part CU for repair are disposed overlapping the anode electrode ANO and the emission area. With this structure, by irradiating a laser from the lower surface of the substrate 110, when the energy of the laser is too high, for example, when using a laser in a wavelength band of 1064 nm suitable for welding, the high energy may adversely affect the light emitting diode OLE. Even though the repair process is performed, the light emitting diode OLE may be damaged or even demolished.

However, according to the electroluminescence display of the present disclosure, it is characterized by using a laser in a wavelength band of 266 nm suitable for cutting the semiconductor layers SA and DA. Accordingly, while the semiconductor layer is cut in the cutting part CU, the metal repair electrode RT and the driving drain electrode DD may be connected at the welding part WD with the low energy laser.

When the repair pattern RA overlapping the repair electrode RT and disposed below is cut by a low energy laser of 266 nm, the absorbed energy melts the repair electrode RT disposed on the upper portion so that the repair electrode RT may be physically and electrically connected to the driving drain electrode DD. That is, the cutting process and the welding process may be performed in a single process using the same laser, rather than as separate process using different lasers.

At this time, as the switching semiconductor layer SA is cut off, the switching gate electrode SG and the switching source electrode SS disposed thereon may be melted and connected each other. Even in this case, the switching thin film transistor ST is disabled.

Referring to FIG. 6A, a laser having a low energy of 266 nm wavelength may be irradiated to the welding part WD and the cutting part CU. The laser is irradiated to the repair pattern RA and the switching semiconductor layer SA disposed on the substrate 110. As a result, as shown in FIG. 6B, the switching semiconductor layer SA is melted and cut by heat at the cutting part CU. Since there is no metal material directly overlapping on the switching semiconductor layer SA, other layers are not affected. In some cases, the switching gate electrode and the switching source electrode may be disposed thereon, but even though the switching gate electrode and the switching source electrode are melted and connected each other, the semiconductor layer is cut and the connectivity is disabled.

In addition, at the welding part WD of FIG. 6B, the repair pattern RA is cut by thermal energy of the laser, and the thermal energy is transferred to the repair electrode RT disposed thereon. The repair electrode RT is melted by the transferred thermal energy and is connected to the driving drain electrode DD overlapping thereon.

Referring to FIG. 7, the switching semiconductor layer SA may be cut off at the cutting part CU, so that the light emitting diode OLE disposed in the defective second pixel P2 is disconnected from the switching thin film transistor ST and the driving thin film transistor DT of the defective second pixel P2. Meanwhile, at the welding part WD, the repair electrode RT and the second driving drain electrode DD2 are connected to each other. The repair electrode RT is connected to the repair line RL. As shown in FIG. 5, since the repair line RL is connected to the first driving drain electrode DD1 of the first pixel P1 which is a normal pixel, the second anode electrode ANO2 is in a connected state for being driven by the first driving drain electrode DD1.

A method for manufacturing an electroluminescence display comprises: a step of forming a first driving element, a second driving element and a repair element on a substrate; forming a first light emitting element and a second light emitting element; inspecting whether the first driving element and the second driving element are defective; and conducting a repair process. The first driving element is formed in a first pixel. The second driving element is formed in a second pixel adjacent to the first pixel. The repair element connected to the first driving element, extending to the second pixel and overlapping the second driving element. The first light emitting element is disposed on and connected to the first driving element. The second light emitting element is disposed on and connected to the second driving element. In the repair process, the second driving element is disabled and the second light emitting element is connected to the first driving element via the repair element, wherein the first driving element is normal and the second driving element is defective.

The first driving element includes: a first gate electrode, a first semiconductor layer overlapping the first gate electrode, a first source electrode connected to one portion of the first semiconductor layer and a first drain electrode connected to another portion of the first semiconductor layer.

The second driving element includes: a second gate electrode, a second semiconductor layer overlapping the second gate electrode, a second source electrode connected to one portion of the second semiconductor layer and a second drain electrode connected to another portion of the second semiconductor layer.

The repair element includes: a repair pattern overlapping the second drain electrode, the repair pattern formed of a first material on a first layer same as the second semiconductor layer; a repair electrode disposed on a gate insulating layer covering the second semiconductor layer and the repair pattern, the repair electrode formed of a second material on a second layer same as the second gate electrode; and a repair line disposed on an intermediate insulating layer covering the repair electrode, the repair line connected to the repair electrode, extending to the first pixel and connected to the first drain electrode.

The repair process includes: cutting a portion of the second semiconductor layer; and removing a part of the repair pattern and connecting the repair electrode to the second drain electrode.

The repair process is conducted by irradiating laser on the portion of the second semiconductor layer, on the repair pattern and where the repair electrode and the second drain electrode overlap, so that the repair electrode and the second drain electrode are melted and connected to each other.

The repair process is conducted by irradiating the laser having a wavelength of 266 nm in a direction from below the substrate toward the second light emitting element.

The features, structures, effects and so on described in the above examples of the present disclosure are included in at least one example of the present disclosure, and are not limited to only one example. Furthermore, the features, structures, effects and the likes explained in at least one example may be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
   a pixel on a substrate;
   a thin film transistor disposed in the pixel, the thin film transistor including a semiconductor layer, a gate electrode and a drain electrode;
   a light emitting diode disposed in the pixel, the light emitting diode connected to the drain electrode; and
   a repair element overlapping the light emitting diode,
   wherein the repair element includes:
      a repair pattern formed of a material on a layer same as the semiconductor layer;
      a repair electrode on a gate insulating layer covering the repair pattern; and
      a repair line on an intermediate insulating layer covering the repair electrode, the repair line connecting to the drain electrode, and
   wherein the repair pattern and the repair electrode overlap the drain electrode disposed on the intermediate insulating layer.

2. The electroluminescence display according to claim 1, wherein the pixel is defective,
   the semiconductor layer and the repair pattern are cut off, and
   the repair electrode and the drain electrode disposed on the repair pattern are physically connected by penetrating the intermediate insulating layer.

3. The electroluminescence display according to claim 2, wherein the repair electrode and the drain electrode are connected by melting.

4. The electroluminescence display according to claim 1, wherein the light emitting diode includes:
   an anode electrode including an opaque metal material, the anode electrode connected to the drain electrode of the thin film transistor;
   an emission layer disposed on the anode electrode; and
   a cathode electrode disposed on the emission layer, the cathode electrode including a transparent conductive material,
   wherein light generated from the emission layer is emitted to the cathode electrode.

5. The electroluminescence display according to claim 4, wherein the light generated from the emission layer of the light emitting element is emitted to the cathode electrode at portions where the repair electrode overlaps the drain electrode of the thin film transistor.

6. An electroluminescence display comprising:
   a first pixel and a second pixel disposed on a substrate;
   a first switching thin film transistor disposed in the first pixel, a first driving thin film transistor connected to the first switching thin film transistor and a first light emitting element connected to the first driving thin film transistor;
   a second switching thin film transistor disposed in the second pixel, a second driving thin film transistor connected to the second switching thin film transistor and a second light emitting element connected to the second driving thin film transistor; and
   a repair element overlapping the first light emitting element and the second light emitting element,
   wherein the repair element includes:
      a repair pattern overlapping a driving drain electrode of the second driving thin film transistor, the repair pattern formed of a first material on a first layer same as a switching semiconductor layer of the second switching thin film transistor;
a repair electrode overlapping the repair pattern on a gate insulating layer covering the switching semiconductor layer and the repair pattern, the repair electrode formed of a second material on a second layer same as a gate electrode of the second switching thin film transistor; and
a repair line disposed on an intermediate insulating layer covering the repair electrode, the repair line connected to the repair electrode and to a drain electrode of the first driving thin film transistor.

7. The electroluminescence display according to claim 6, wherein the first pixel is normal and the second pixel is defective,
the switching semiconductor layer of the second switching thin film transistor and the repair pattern are cut off; and
the repair electrode penetrates the intermediate insulating layer to connect the driving drain electrode of the second driving thin film transistor.

8. The electroluminescence display according to claim 7, wherein the repair electrode and the driving drain electrode of the second driving thin film transistor are melted to connect each other.

9. The electroluminescence display according to claim 6, wherein the second light emitting element includes:
an anode electrode including an opaque metal material, the anode electrode connected to the driving drain electrode of the second driving thin film transistor;
an emission layer disposed on the anode electrode; and
a cathode electrode disposed on the emission layer, the cathode electrode including a transparent conductive material,
wherein light generated from the emission layer is emitted to the cathode electrode.

10. The electroluminescence display according to claim 9, wherein the light generated from the emission layer of the second light emitting element is emitted to the cathode electrode at portions where the repair electrode overlaps the driving drain electrode of the second driving thin film transistor.

11. An electroluminescence display, comprising:
a first pixel including a first switching transistor, a first driving transistor, and a first light emitting element;
a second pixel including a second switching transistor, a second driving transistor, and a second light emitting element;
a repair element at least a part of which overlapping the first pixel and the second pixel;
wherein the second switching transistor includes a semiconductor layer including a first part and a second part electrically disconnected from the first part of the semiconductor layer;
wherein the repair element includes:
a repair pattern overlapping a drain electrode of the second driving transistor, the repair pattern formed of a same material as the semiconductor layer of the second switching transistor and including a first portion and a second portion electrically disconnected from the first portion of the repair pattern;
a repair electrode overlapping the repair pattern on a gate insulating layer covering the semiconductor layer and the repair pattern, the repair electrode formed of a same material as a gate electrode of the second switching transistor and joined with the drain electrode of the second driving transistor; and
a repair line disposed on an intermediate insulating layer covering the repair electrode, the repair line electrically connected to the repair electrode and to a drain electrode of the first driving transistor; and
wherein an anode of the second light emitting element of the second pixel is electrically connected to the drain electrode of the first driving transistor of the first pixel via the drain electrode of the second driving transistor, the repair electrode, and the repair line.

12. The electroluminescence display according to claim 11, wherein the first pixel is a normal pixel and the second pixel is a defective pixel.

13. The electroluminescence display according to claim 11, wherein the repair electrode and the drain electrode of the second driving transistor are melted to be joined with each other.

14. A method for manufacturing an electroluminescence display comprising:
forming a first driving element in a first pixel, a second driving element in a second pixel adjacent to the first pixel, and a repair element on a substrate, the repair element connected to the first driving element, extending to the second pixel and overlapping the second driving element;
forming a first light emitting element disposed on and connected to the first driving element, and a second light emitting element disposed on and connected to the second driving element;
inspecting whether the first driving element and the second driving element are defective; and
conducting a repair process in which the second driving element is disabled and the second light emitting element is connected to the first driving element via the repair element, wherein the first driving element is normal and the second driving element is defective.

15. The method for manufacturing the electroluminescence display according to claim 14,
wherein the first driving element includes: a first gate electrode, a first semiconductor layer overlapping the first gate electrode, a first source electrode connected to one portion of the first semiconductor layer and a first drain electrode connected to another portion of the first semiconductor layer,
wherein the second driving element includes: a second gate electrode, a second semiconductor layer overlapping the second gate electrode, a second source electrode connected to one portion of the second semiconductor layer and a second drain electrode connected to another portion of the second semiconductor layer, and
wherein the repair element includes:
a repair pattern overlapping the second drain electrode, the repair pattern formed of a first material on a first layer same as the second semiconductor layer;
a repair electrode disposed on a gate insulating layer covering the second semiconductor layer and the repair pattern, the repair electrode formed of a second material on a second layer same as the second gate electrode; and
a repair line disposed on an intermediate insulating layer covering the repair electrode, the repair line connected to the repair electrode, extending to the first pixel and connected to the first drain electrode.

16. The method for manufacturing the electroluminescence display according to claim 15, wherein the repair process includes:
cutting a portion of the second semiconductor layer, and removing a part of the repair pattern and connecting the repair electrode to the second drain electrode.

17. The method for manufacturing the electroluminescence display according to claim 16, wherein the repair process is conducted by irradiating laser on the portion of the second semiconductor layer, on the repair pattern and where the repair electrode and the second drain electrode overlap, so that the repair electrode and the second drain electrode are melted and connected to each other.

18. The method for manufacturing the electroluminescence display according to claim 17, wherein the repair process is conducted by irradiating the laser having a wavelength of 266 nm in a direction from below the substrate toward the second light emitting element.

* * * * *